United States Patent [19]

McDonald

[11] 4,246,546

[45] Jan. 20, 1981

[54] APPARATUS AND METHOD FOR LOCKING A PLL ONTO A SELECTED OFFSET FREQUENCY SIDEBAND

[75] Inventor: Thomas W. McDonald, Scottsdale, Ariz.

[73] Assignee: Motorola, Inc., Schaumburg, Ill.

[21] Appl. No.: 27,200

[22] Filed: Apr. 5, 1979

[51] Int. Cl.³ .................................................. H03L 7/12
[52] U.S. Cl. ............................................ 331/4; 331/25; 331/31; 331/22
[58] Field of Search .................... 331/4, 10, 11, 17, 18, 331/22, 25, 31

[56] References Cited

U.S. PATENT DOCUMENTS

| | | | |
|---|---|---|---|
| 3,852,682 | 12/1974 | Dawe et al. | 331/4 |
| 4,009,448 | 2/1977 | Hopwood et al. | 331/4 |
| 4,077,016 | 2/1978 | Sanders et al. | 331/4 |

Primary Examiner—Siegfried H. Grimm
Assistant Examiner—Edward P. Westin
Attorney, Agent, or Firm—Eugene A. Parsons

[57] ABSTRACT

The output of a VCO, a referenced frequency signal and an offset frequency signal are mixed to provide a control signal for the VCO and a double offset frequency signal which is mixed with an output of the offset frequency source to provide a DC component having a positive polarity if the signals are inphase and the VCO is locked on one sideband and a negative polarity if the signals are out of phase and the VCO is locked on the other sideband. A sweep signal is activated and applied to the VCO in response to the VCO being locked onto the wrong sideband.

9 Claims, 5 Drawing Figures

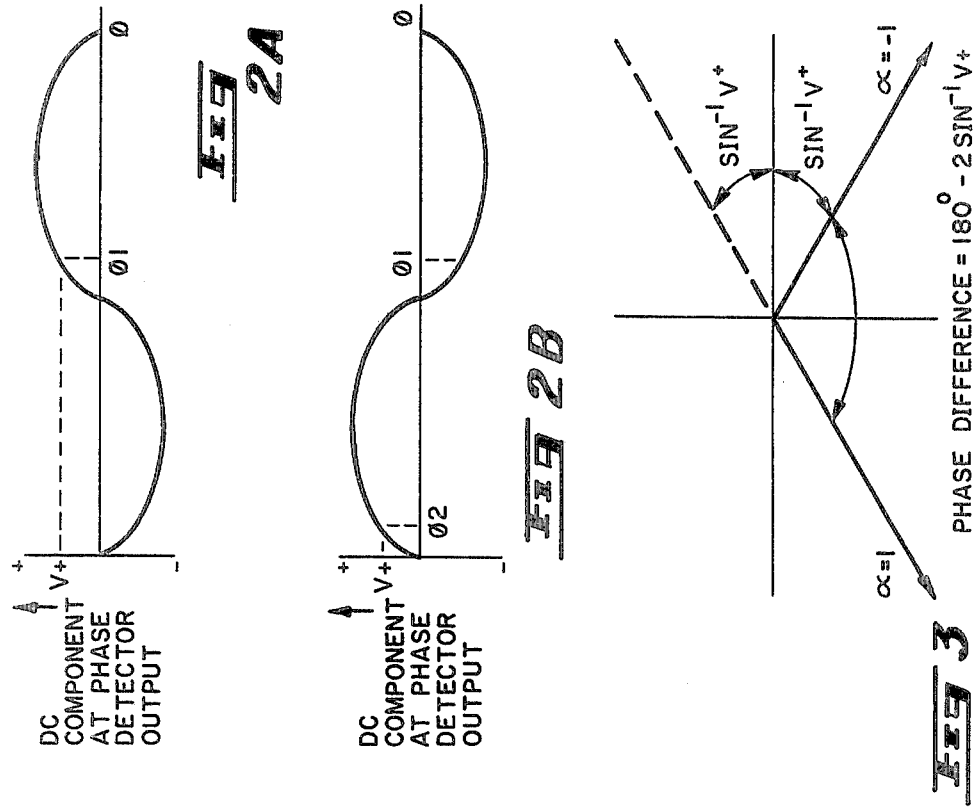
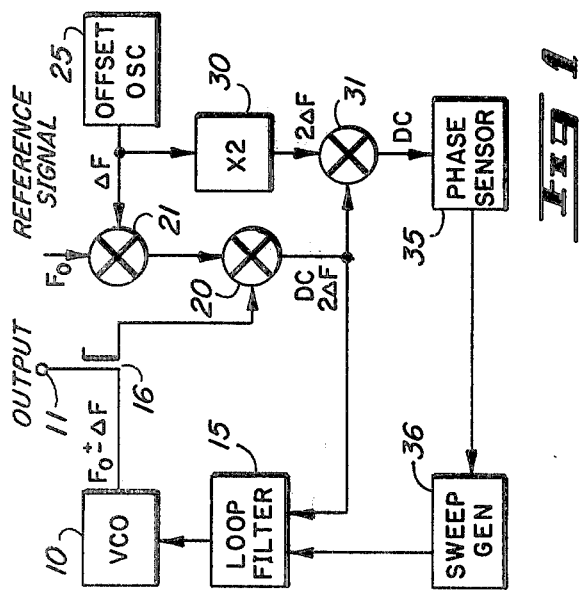
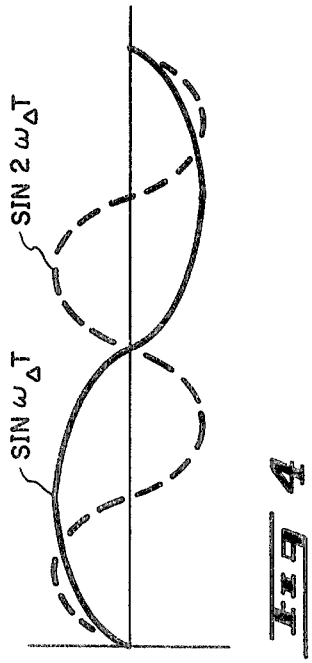

APPARATUS AND METHOD FOR LOCKING A PLL ONTO A SELECTED OFFSET FREQUENCY SIDEBAND

BACKGROUND OF THE INVENTION

In phase locked loops wherein a voltage controlled oscillator is controlled to phase lock onto a frequency spaced from a reference frequency by a specific offset frequency, it is well known in the art that the VCO can lock onto a frequency above the reference signal by the offset frequency (upper sideband) or below the reference signal by the offset frequency (lower sideband). It is, of course, essential that the VCO lock onto the desired sideband and toward this end elaborate and critical single sideband mixing techniques are used in many circuits. Single sideband mixing techniques require relatively complicated RF hardware and relatively critical parameters depending upon sideband suppression, carrier suppression, etc.

In U.S. Pat. No. 4,009,448, entitled "Phase Lock Loop For A Voltage Controlled Oscillator" issued Feb. 22, 1977, apparatus is disclosed wherein a phase locked loop can be locked onto a desired sideband without using the prior single sideband mixing techniques. This apparatus utilizes inphase and quadrature mixers to sense the sideband to which the VCO is locked. In the patent the apparatus is locked to the upper sideband and, if the VCO locks on the lower sideband, a sweep circuit is activated to unlock the VCO and cause it to continue sweeping. This apparatus requires relatively complicated 90° phase shifting circuitry. Also, the bandwidth of the apparatus is somewhat reduced because of the lock sensing apparatus.

SUMMARY OF THE INVENTION

The present application pertains to a phase locked loop wherein a voltage controlled oscillator is controlled to phase lock onto a frequency spaced from a reference frequency by a specific offset frequency and including apparatus and method for locking the voltage controlled oscillator onto a selected one of the upper and lower sidebands wherein the output of the VCO, a reference frequency signal and an offset frequency signal are mixed to provide a control signal for the VCO and a double offset frequency signal which is compared to the offset frequency signal to determine the sideband onto which the VCO is locked and, if the VCO is locked onto the wrong sideband, a sweep generator is activated to unlock the VCO and cause it to sweep until it locks onto the correct sideband. The double offset frequency signal from the mixing operation has a first phase for the upper sideband and a 180° phase difference for the opposite sideband. Therefore, the phase of the double offset frequency signal from the mixing operation is indicative of the sideband upon which the VCO is locked and this phase can be determined by comparing the signal to the offset frequency signal from an external source, such as an offset oscillator. No phase shifting circuits are required thereby reducing the required circuitry to a minimum. Also, because of the simplicity of the circuit, the bandwidth of the apparatus is relatively broad compared to the apparatus set forth in the above described patent.

It is an object of the present invention to provide a new and improved phase locked loop including improved apparatus for locking the loop onto a selected one of the upper and lower sidebands.

It is a further object of the present invention to provide a new and improved phase locked loop including apparatus for locking the voltage controlled oscillator onto a selected one of the upper and lower sidebands, which apparatus is simplified and has a relatively broad bandwidth.

These and other objects of this invention will become apparent to those skilled in the art upon consideration of the accompanying specification, claims and drawings.

BRIEF DESCRIPTION OF THE DRAWINGS

Referring to the drawings,

FIG. 1 is a block diagram of a phase locked loop embodying the present invention;

FIGS. 2A and 2B illustrate the possible dc levels present in portions of the circuitry of FIG. 1 depending upon the phase error term present when the loop is locked;

FIG. 3 is a vector representation of signals present in the apparatus of FIG. 1; and FIG. 4 illustrates the phase relationship of signals present in FIG. 1.

DESCRIPTION OF THE PREFERRED EMBODIMENT

Referring specifically to FIG. 1, a voltage controlled oscillator (VCO) designated 10 has an output connected to an output terminal 11, adapted to be connected to further apparatus for use of the output signal and a control input connected to receive control signals from a loop filter 15. The output signal of the VCO 10 is sensed by a coupling device 16 and applied to one input of a multiplier or mixer 20. A second input of the mixer 20 is connected to an output of another mixer 21. The mixer 21 has a first input adapted to receive a reference signal, $F_o$, and a second input adapted to receive an offset frequency signal, $\Delta F$. The reference signal, $F_o$, may be obtained from other equipment or from any desired reference signal source. The offset signal, $\Delta_F$, may be obtained from an offset oscillator 25 or from any convenient source. An output of the mixer 20 is connected to an input of the loop filter 15 and supplies a DC control signal to the loop filter 15 which controls the VCO 10 to a locked condition.

The offset frequency signal from the offset oscillator 25 is also applied through a doubling circuit 30 to one input of a mixer 31. A second input of the mixer 31 is connected to the output of the mixer 20 for receiving a double offset frequency signal therefrom. An output of the mixer 31 is applied to a phase sensor 35, the output of which is connected to a sweep generator 36. Sweeping signals from the generator 36 are applied through the loop filter 15 to the control input of the VCO 10 to cause the VCO 10 to sweep toward a locked condition. The sweep generator 36 may be any convenient circuitry such as a hysteresis amplifier and integrator, which will provide the requisite sweep signals to cause the VCO 10 to sweep toward a locked condition. No specific sweep generator circuit is disclosed herein since many of these type circuits are well known to those skilled in the art and any of these circuits might be utilized with equal advantage.

In the operation of the circuit illustrated in FIG. 1, the VCO 10 is controlled to phase lock onto a frequency, $F_o + \Delta_F$ spaced from the reference frequency, $F_o$, by a specific offset frequency. If the VCO 10 locks on a frequency equal to the reference signal plus the offset signal, $F_o + \Delta_F$, it is said to have locked onto the upper sideband. If the VCO 10 locks onto a frequency equal to the reference signal minus the offset signal, $F_o - \Delta_F$, it is said to have locked onto the lower sideband. Since the phase locked loop normally locks onto either the upper or the lower sideband without discriminating therebetween, it is essential that the desired sideband be selected and apparatus for preventing the loop from locking onto the incorrect sideband be incorporated.

Assuming that the reference signal, $F_o$, equals sin ($W_o t$) and the offset signal, $\Delta_F$, equals sin ($W_\Delta t$), then the output signal from the mixer 21 equals $$\cos [(W_o - W_\Delta)t] - \cos [W_o + W_\Delta)t]$$

also, if the output signal from the VCO 10 equals $$\sin [(W_o + \alpha W_\Delta)t + \phi]$$

then the output of the mixer 20 equals $$\sin [W_\Delta(1+\alpha)t + \phi] + \sin [W_\Delta(1-\alpha)t - \phi],$$

where the output signals from the mixers 20 and 21 are simple trigonometric multiplications of the input signals thereto. Also, in these expressions the term $\alpha$ is utilized to indicate upper and lower sidebands and can only take the values of plus or minus 1. That is, the VCO 10 and associated loop can only lock when $\alpha$ is $+-1$.

In the case where $\alpha = 1$, the output signal from the mixer 20 becomes $$\sin (2W_\Delta t + \phi) + \sin (-\phi).$$

The DC component of this signal is the last portion thereof or $-\sin \phi$. Referring to FIG. 2A, which illustrates the possible DC levels present at the output of mixer, or phase detector, 20 depending upon the phase error term present when the loop is locked, the loop will lock somewhere on either the positive slope or the negative slope of the curve illustrated depending upon the nature of the loop filter 15. Assume that the loop filter 15 is constructed so that lock is achieved on positive slope of the curve illustrated in FIG. 2A and that it occurs at a DC level, $V_+$, corresponding to $\phi_1$. It should be noted that with a high DC loop gain the DC level at which the loop locks, $V_+$, will approach 0. Substituting $\phi_1$ for $\phi$ in the prior expression, the output signal from the mixer 20 with $\alpha =$ to 1 becomes $$\sin (2W_\Delta t + \phi_1) - \sin \phi_1.$$

When $\alpha = -1$ the signal at the output of the mixer 20 becomes $$\sin \phi + \sin (2W_\Delta t - \phi).$$

Since the DC component of the expression has shifted phase, the wave form illustrated in FIG. 2B now applies and it can be seen that lock is achieved at $\phi_2$ where the DC level, $V_+$, is reached on the positive slope. Notice that $\phi_1$ is 180° out of phase with respect to $\phi_2$. Using $\phi_2$ as a reference, $$\phi_2 = \sin^{-1} V_+$$

in the first quadrant and $$\phi_1 = \sin^{-1} V_+ + 180°.$$

These relationships can be seen by referring to FIG. 3. Substituting the above definition of $\phi_1$ into the previous expression for the output signal from the mixer 20 when $\alpha = 1$ produces the following:

$$\sin (2W_\Delta t + \sin^{-1} V_+ + 180°) - \sin (\sin^{-1} V_+ + 180°)$$

which simplifies to $$-\sin (2W_\Delta t + \sin^{-1} V_+) + V_+.$$

Also, when $\alpha = -1$ the expression becomes $$V_+ + \sin (2W_\Delta t - \sin^{-1} V_+).$$

It should be noted that the two $\Delta F$ beatnote (double offset frequency signal) changes sign when $\alpha$ or the sideband, is changed. By noting the phase of the $2\Delta F$ beatnote relative to the $W_\Delta t$ modulating signal (the output signal from the offset oscillator 25) the sideband upon which lock occurs can be identified. This is illustrated in FIG. 4. Notice from FIG. 4 that the waveform sin $W_\Delta t$ crosses 0 in a positive going direction when the waveform sin $2W_\Delta t$ is positive going, when $\alpha = -1$. When $\alpha = +1$ the waveform of $-\sin 2W_\Delta t$ (not shown) would be negative going or 180° out of phase with the waveform shown in FIG. 4. This phase difference forms the basis of the phase comparison by which the polarity of $\alpha$ is determined. Simple digital sampling circuitry could be implemented which would determine the polarity of $\alpha$ and force the phase locked loop to unlock if it had locked on the wrong sideband.

In the present embodiment the output signal from the offset oscillator 25 is doubled in the doubler 30 and compared to the double offset frequency signal from the mixer 20 in the mixer 31. Since the single offset frequency signal from the oscillator 25 has the phase relationship illustrated in FIG. 4, the double offset frequency signal from the doubler 30 will be in phase or out of phase with the double offset frequency signal from the mixer 20. In the present embodiment the mixer 31 is constructed so that it simply multiplies the inputs and a positive DC signal appears at the output if the two input signals are inphase, while a negative signal appears at the output if the input signals are out of phase. The phase sensor 35 simply senses a positive or negative DC signal from the mixer 31 and supplies an activating signal to the sweep generator 36 if the VCO 10 is locked on a sideband which is not the selected sideband. The phase sensor 35 may be, for example, a simple threshold circuit, etc. Also, while a double offset frequency signal is supplied from the offset oscillator 25 to the circuitry for determining the phase relationship between the output signal of the offset oscillator and the output signal of the mixer 20, it should be understood that a single offset frequency signal might be utilized (as explained above) or any integer multiple (one or more) which can be conveniently utilized.

Thus, a phase lock loop is disclosed wherein a voltage controlled oscillator is controlled to phase lock onto a frequency spaced from a reference frequency by a specific offset frequency. Further, the loop includes apparatus for locking the VCO onto a selected one of the upper and lower sidebands and the apparatus utilized is relatively simple. Because no phase shifting circuitry or the like is required, the bandwidth of the apparatus is maintained relatively broad and the device can be easily implemented in digital hardware. Also, in many cases the offset frequency is derived in a frequency divider chain and the present implementation eliminates the use of additional hardware since the doubler 30 will already be included in the chain.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. A phase locked loop wherein a voltage controlled oscillator is controlled to phase lock onto a frequency spaced from a reference frequency by a specific offset frequency and including apparatus for locking the voltage controlled oscillator onto a selected one of the upper and lower sidebands, said phase locked loop comprising:
   (a) a voltage controlled oscillator providing an output signal and having a control input;
   (b) a reference frequency source;
   (c) an offset frequency source providing an offset frequency signal and a signal at an integer multiple of the offset frequency;
   (d) first mixing means coupled to receive the output signal of said voltage controlled oscillator and further coupled to said reference frequency source and to receive the offset frequency signal from said offset frequency source, said first mixing means being coupled to provide an output signal including a control component and a component having a frequency equal to twice the offset frequency when the voltage controlled oscillator is locked;
   (e) means coupling the control component from the first mixing means to the control input of said voltage controlled oscillator; and
   (f) means coupled to said first mixing means, said offset frequency source and said coupling means for comparing the phase of the double offset frequency component from said first mixing means to the integer multiple signal from said offset frequency source and providing a sweeping signal to said coupling means until the phase comparison indicates the selected sideband is in phase lock.

2. A phase locked loop as claimed in claim 1 wherein the integer multiple of the offset frequency source is the second harmonic.

3. A phase locked loop as claimed im claim 1 wherein the coupled means includes a second mixer connected to receive the double offset frequency component from the first mixing means and the integer multiple signal from the offset frequency source and provide an output signal with a DC component which has a first polarity for one sideband and a second polarity for the other sideband.

4. A phase locked loop as claimed in claim 3 wherein the coupled means further includes polarity sensitive means connected to the second mixer and providing an output signal in response to the application of a signal thereto of the polarity of the unselected sideband.

5. A phase locked loop as claimed in claim 4 wherein the coupled means further includes a sweep generator connected to the polarity sensitive means for providing a sweep signal to the coupling means in response to the output signal from the polarity sensitive means.

6. A phase locked loop wherein a voltage controlled oscillator is controlled to phase lock onto a frequency spaced from a reference frequency by a specific offset frequency and including apparatus for locking the voltage controlled oscillator onto a selected one of the upper and lower sidebands, said phase locked loop comprising:
   (a) a voltage controlled oscillator providing an output signal and having a control input;
   (b) a reference frequency source;
   (c) an offset frequency source providing an offset frequency signal and a signal at twice the offset frequency;
   (d) first mixing means coupled to receive the output signal of said voltage controlled oscillator and further coupled to said reference frequency source and to receive the offset frequency signal from said offset frequency source, said first mixing means being coupled to provide an output signal including a control component and a component having a frequency equal to twice the offset frequency when the voltage controlled oscillator is locked;
   (e) means coupling the control component from the first mixing means to the control input of said voltage controlled oscillator;
   (f) second mixing means connected to receive the component from the first mixing means having a frequency equal to twice the offset frequency and to receive the signal from the offset frequency source at twice the offset frequency and to provide a DC output signal having a first polarity when said voltage controlled oscillator is locked on the selected sideband and a second polarity when said voltage controlled oscillator is locked on the other sideband; and
   (g) means coupled to receive the DC output signal from said second mixing means and further coupled to said coupling means for supplying a sweeping signal to the control input of said voltage controlled oscillator whenever the DC output signal from said second mixing means is the second polarity.

7. In a phase locked loop wherein a voltage controlled oscillator is controlled to phase lock onto a frequency spaced from a reference frequency by a specific offset frequency and adapted to have attached thereto a reference frequency signal source and an offset frequency signal source, a method of locking the voltage controlled oscillator onto a selected one of the upper and lower sidebands comprising the steps of:
   (a) mixing an output from the voltage controlled oscillator with the reference frequency signal and the offset frequency signal to provide a control signal for the voltage controlled oscillator and a signal having a frequency equal to twice the offset frequency when the voltage controlled oscillator is locked;
   (b) comparing the phase of the double offset frequency signal from the mixing process to an integer multiple of the offset frequency signal from the source, a first phase relationship indicating the voltage controlled oscillator has locked onto the selected sideband and a second phase relationship indicating the voltage controlled oscillator has locked onto the other sideband; and (c) forcing the voltage controlled oscillator to unlock and sweep in response to the occurrence of a second phase relationship.

8. A method as claimed in claim 7 including in addition the step of doubling the frequency of the offset frequency signal from the source prior to the comparing step.

9. A method as claimed in claim 7 wherein the comparing step includes mixing the double offset frequency signal from the prior mixing process with the integer multiple of the offset frequency signal from the source to obtain a DC component having a first polarity for the selected sideband and a second polarity for the other sideband.

* * * * *